United States Patent
Hladik et al.

(10) Patent No.: US 6,192,501 B1
(45) Date of Patent: Feb. 20, 2001

(54) HIGH DATA RATE MAXIMUM A POSTERIORI DECODER FOR SEGMENTED TRELLIS CODE WORDS

(75) Inventors: Stephen Michael Hladik, Albany; Nick Andrew Van Stralen; John Anderson Fergus Ross, both of Schenectady, all of NY (US)

(73) Assignee: General Electric Company, Schenectady, NY (US)

(*) Notice: Under 35 U.S.C. 154(b), the term of this patent shall be extended for 0 days.

(21) Appl. No.: 09/137,181

(22) Filed: Aug. 20, 1998

(51) Int. Cl.$^7$ .................. H03M 13/23; H03M 13/29; H03M 13/39
(52) U.S. Cl. ............... 714/786; 714/755; 714/792; 714/794
(58) Field of Search .................. 714/755, 786, 714/792, 794

(56) References Cited

U.S. PATENT DOCUMENTS

| | | | |
|---|---|---|---|
| 5,406,570 | 4/1995 | Berrou et al. | 371/43 |
| 5,446,747 | 8/1995 | Berrou | 371/45 |
| 5,511,073 * | 4/1996 | Padovani et al. | 370/82 |
| 5,663,957 * | 9/1997 | Dent | 370/347 |
| 5,721,745 | 2/1998 | Hladik et al. | 371/43 |
| 5,721,746 | 2/1998 | Hladik et al. | 371/43 |
| 5,734,962 | 3/1998 | Hladik et al. | 455/12.1 |
| 5,862,132 * | 1/1999 | Blanchard et al. | 370/342 |

OTHER PUBLICATIONS

Benedetto et al., "Performance of Continuous and Block-wise Decoded Turbo Codes", IEEE Communications Letters, vol. 1, No. 3, May 1997, pp. 77–79.*

"Illuminating the Structure of Code and Decoder of Parallel Concatenated Recursive Systematic (Turbo) Codes," Patrick Robertson, IEEE, 1994, pp. 1298–1303.

"Optimal Decoding of Linear Codes for Minimizing Symbol Error Rate," LR Bahl, J Cocke, F. Jelinek; J. Raviv, IEEE Transactions on Information Theory, Mar. 1974, pp. 284–287.

"Near Shannon Limit Error–Correcting Coding and Decoding: Turbo–Codes (1)," Claude Berrou, Alain Glavieux; Punya Thitimajshima, IEEE, 1993, pp. 1064–1070.

* cited by examiner

*Primary Examiner*—Stephen M. Baker
(74) *Attorney, Agent, or Firm*—Jill M. Breedlove; Douglas E. Stoner (57) ABSTRACT

In a communications system, a trellis code word is segmented by both the encoder and a segmented MAP decoder. The segmented MAP decoder operates on code word segments as if they were individual code words and takes advantage of knowing the state of the encoder at specified times to reduce decoding latency and required memory. In a turbo coding system, for example, coding gain is maintained by interleaving the information bits across the segments of a component code word.

20 Claims, 9 Drawing Sheets fig. 1 fig. 2

*fig. 3A* fig. 3B fig. 4 fig. 5 fig. 6 fig. 7 fig. 8

HIGH DATA RATE MAXIMUM A POSTERIORI DECODER FOR SEGMENTED TRELLIS CODE WORDS

BACKGROUND OF THE INVENTION

The maximum a posteriori (MAP) decoding algorithm introduced by Bahl, Cocke, Jelinick, and Raviv in "Optimal Decoding of Linear Codes for Minimizing Symbol Error Rate", *IEEE Transactions on Information Theory*, March 1974, pp. 284–287, also known as the BCJR algorithm, is an optimum symbol-by-symbol decoder for trellis codes. It is particularly useful as a component decoder in decoding parallel concatenated convolutional codes, i.e. turbo codes, because of its excellent performance. It is advantageous for decoding turbo codes because it accepts soft-decision information as an input and produces soft-decision output information. However, one problem with this type of decoder is that it requires a relatively large amount of memory. For example, the entire received code word must be stored during decoding due to the nature of the algorithm. Furthermore, in order to obtain high-speed decoding, it is necessary to store a large number of intermediate results which represent various event probabilities of interest so that they can be combined with other results later in the decoding process, which decoding process comprises forward and backward (from the end to the beginning of a received code word) recursive calculations. The MAP algorithm as described by Bahl et al. requires that at least half of the results from the two recursive calculations be stored in memory for fast decoding.

Memory size is a particular problem in turbo coding systems since bit-error rate is inversely proportional to the number of information bits in the code word. (The term "block size" as used herein refers to the number of information bits in a code word.) In a turbo coding system, therefore, it would be desirable to utilize the largest block size possible in order to obtain the greatest coding gain. Unfortunately, an efficient and practical system utilizing such a large block size has not emerged heretofore.

Therefore, it is desirable to provide a method and system for encoding and decoding large trellis codes, which method and system require a significantly reduced memory without compromising coding gain and without additional overhead. It is furthermore desirable that such a method and system be applicable to turbo coding such that an efficient and practical turbo coding system is realizable.

SUMMARY OF THE INVENTION

In a communications system, a trellis code word is segmented by both the encoder and a segmented symbol-by-symbol MAP decoder, advantageously reducing required memory size with insignificant loss in coding gain and little or no additional overhead. The encoder periodically returns to a known state by the insertion of "tail" or "merge" bits into the sequence of information bits from the source. The segmented MAP decoder operates on code word segments as if they were individual code words and takes advantage of knowing the state of the encoder at specified times to reduce decoding latency and required memory. This is applicable to a turbo coding system, for example, wherein the coding gain is maintained by interleaving the information bits across the segments of a component code word. The result is an efficient and practical turbo decoder.

DETAILED DESCRIPTION OF THE INVENTION

Summary of the MAP Decoding Algorithm

The maximum a posteriori (MAP) algorithm for decoding linear codes was published by Bahl, Cocke, Jelinek, and Raviv, as cited hereinabove. Basically, this algorithm calculates the a posteriori probability of each state in a trellis corresponding to a received code word conditioned on the entire received code word. A variation of this algorithm calculates the a posteriori probability of each state transition in a trellis corresponding to a received code word conditioned on the received code word. Since this variation is of particular interest when decoding recursive systematic convolutional codes, which are typically utilized in turbo coding, the description of the invention will be built around this form of the algorithm. However, the invention also applies to the version of the MAP algorithm that calculates a posteriori state probabilities in a straightforward manner.

Figure 1:
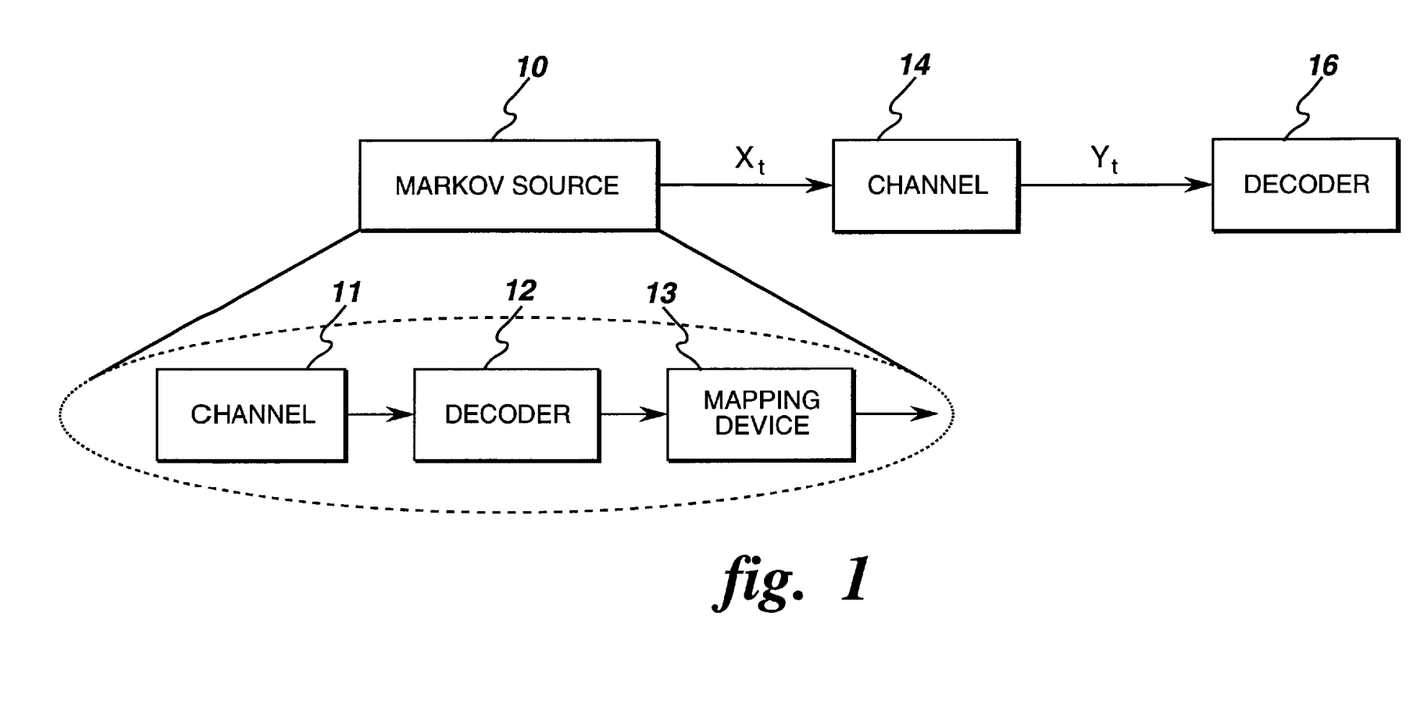
FIG. 1 is a block diagram of a simple communication system comprising a Markov source, a memoryless channel and decoder.

Consider the simple communication system block diagram of FIG. 1 for the purpose of describing the MAP algorithm. The source 10 is a discrete-time, finite-state Markov process, shown as comprising a source 11, an encoder 12, and a mapping device 13. As shown, Markov source's output at time t is $X_t$ and the corresponding channel 14 output is $Y_t$, which is provided as the input to a decoder 16. The following definitions are also needed to describe the MAP algorithm. Let M=the number of distinct states of the Markov source;

m=the index of the Markov source's states $\{0,1, \ldots, M-1\}$;

$S_t$=state of the Markov source at time t;

$S_t^u = S_t, S_{t+1}, \ldots S_u$, the state sequence of the Markov source from time t to time u;

$X_t^u = X_t, X_{t+1}, \ldots X_u$, the output sequence of the Markov source from time t to time u;

$Y_t^u = Y_t, Y_{t+1}, \ldots Y_u$, the output sequence of the channel from time t to time u, and L=the length of the Markov source's output sequence.

Furthermore, it is assumed that the source's initial state $S_0=0$ and its final state $S_L=0$.

The channel is noisy and memoryless so that a sequence of the source's output symbols $X_t^u$ is transformed into a sequence of channel outputs $Y_t^u$ according to the following channel transition probabilities.

$$Pr\{Y_t^u|X_t^u\}=Pr\{Y_t|X_t\}Pr\{Y_{t+1}\}\ldots Pr\{Y_u|X_u\} \qquad (1)$$

The decoder examines the received channel output sequence and estimates the a posteriori probabilities of the Markov source's states or state transitions. The state a posteriori probabilities $Pr\{S_t=m|Y_1^L\}$ can be written as $$Pr\{S_t=m|Y_1^L\}=Pr\{S_t=m;\ Y_1^L\}/Pr\{Y_1^L\} \qquad (2)$$

using the definition of conditional probability. Our notation is as follows: $Pr\{A|B\}$ means the conditional probability of event A given event B, and $Pr\{A;B\}$ means the joint probability of events A and B. Similarly, the source's state transition a posteriori probabilities can be written as $$Pr\{S_{t-1}=m';\ S_t=m|Y_1^L\}=Pr\{S_{t-1}=m';\ S_t=m;\ Y_1^L\}/Pr\{Y_1^L\}. \qquad (3)$$

It turns out that it is easier to derive an algorithm to calculate the joint probabilities on the right-hand sides of equations (2) and (3). The desired conditional probabilities can then be obtained by simply dividing these joint probabilities by the constant $Pr\{Y_1^L\}$. To clarify the derivation, Bahl et al. defined the following probability functions.

$$a_t(m)=Pr\{S_t=m;\ Y_1^t\} \qquad (4)$$

$$b_t(m)=Pr\{Y_{t+1}^L|S_t=m\} \qquad (5)$$

$$g_t(m',m)=Pr\{S_t=m;\ Y_t|S_{t-1}=m'\} \qquad (6)$$

It can be shown that $$Pr\{S_t=m;\ Y_1^L\}=\alpha_t(m)\beta_t(m) \qquad (7)$$

and $$Pr\{S_{t-1}=m';\ S_t=m;\ Y_1^L\}=\alpha_{t-1}(m')\gamma_t(m',m)\beta_t(m) \qquad (8)$$

so all that remains is to calculate the values of $\alpha_t(m)\gamma_t(m',m)$ and $\beta_t(m)$ for all values of m and t. It can be shown that for $t=1,2,\ldots,L$, $\alpha_t(m)$ can be calculated recursively as follows.

$$\alpha_t(m) = \sum_{m'=0}^{M-1} \alpha_{t-1}(m')\gamma_t(m', m) \qquad (9)$$

For t=0, the boundary conditions are $\alpha_0(0)=1$ and $\alpha_0(m)=0$ for all $m\neq 0$. Similarly, $\beta_t(m)$ can be calculated recursively for $t=1,2,\ldots,L-1$.

$$\beta_t(m) = \sum_{m'=0}^{M-1} \beta_{t+1}(m')\gamma_{t+1}(m, m') \qquad (10)$$

For t=L, the boundary conditions are $\beta_L(0)=1$ and $\beta_L(m)=0$ for all $m\neq 0$.

$$\gamma_t(m', m) = \sum_X Pr\{S_t = m \mid S_{t-1} = m'\}. \qquad (11)$$

$$Pr\{X_t = X \mid S_t = m; S_{t-1} = m'\}Pr\{Y_t \mid X\}$$

For the cases of interest to us, the source's mapping of state transitions to output symbols is deterministic; i.e. there is only one possible output symbol X for each state transition, so that $Pr\{X_t|S_t=m;\ S_{t-1}=m'\}=1$ and $g_t(m',m)$ can be written as $$\gamma_t(m',m)=Pr\{S_t=m|S_{t-1}=m'\}Pr\{Y_t|X\}. \qquad (12)$$

The calculation of $Pr\{S_{t-1}=m';\ S_t=m;\ Y_1^L\}$ using the algorithm of Bahl et al. can be summarized as follows.

1. $\alpha_0(0)=1$ and $\alpha_0(m)=0$ for all $m\neq 0$. $\beta_L(0)=1$ and $\beta_L(m)=0$ for all $m\neq 0$.
2. As soon as $Y_t$ is received, the decoder computes $\gamma_t(m',m)$ using equation (11) and $\alpha_t(m)$ using equation (9). The calculated values of $\alpha_t(m)$ are stored for all t and m. The calculated values of $\gamma_t(m',m)$ are stored for all t and all transitions (m',m).
3. After the complete sequence of channel outputs $Y_1^L$ is received, the decoder recursively computes $\beta_t(m)$ using equation (10). When all of the $\beta_t(m)$ have been computed, they can be multiplied by the appropriate $\alpha_{t-1}(m')$ and $\gamma_t(m',m)$ to obtain $Pr\{S_{t-1}=m';\ S_t=m;\ Y_1^L\}$ as in equation (8).

When decoding trellis codes, the Markov source of FIG. 1 can be modeled as comprising a source of information bits, an encoder for the error correcting trellis code, and a mapping device that converts the encoder's output into symbols $X_t$, which are transmitted over the channel.

The term $Pr\{S_t=m|S_{t-1}=m'\}$, the encoder's conditional state probability, in equation (12) is calculated as $$Pr\{S_t = m \mid S_{t-1} = m'\} = \prod_{i=(t-1)k+1}^{tk} Pr\{d_i = a_i(m', m)\} \qquad (13)$$

for an (n,k,v) code where $Pr\{d_i=a_i(m',m)\}$ is the a priori probability that $d_i=a_i(m',m)$ and $a_i(m',m)$ is the $i^{th}$ bit of the sequence a(m',m) of k bits that drives the encoder from state m' to state m. This equation holds when the code's trellis does not have parallel branches. (If the code's trellis does have parallel branches, then $Pr\{S_t=m|S_{t-1}=m'\}$ is calculated as the sum of products of bit a priori probabilities in which the sum is over the all of the sequences of source bits a(m',m) that drive the encoder from state m' to state m.) In the decoder, we are interested in event likelihood ratios; specifically, we are interested in $Pr\{d_\tau=1|Y_1^L\}/Pr\{d_\tau=0|Y_1^L\}$, where $Pr\{d_\tau=i|Y_1^L\}$ represents the a posteriori probability that data bit $d_\tau$ from the source is equal to $i\in\{0,1\}$.

$$Pr\{d_\tau = 1 \mid Y_1^L\} = \sum_{(m',m)\in A_t(\tau)} Pr\{S_{t-1} = m'; S_t = m \mid Y_1^L\} \qquad (14)$$

$$= \frac{\sum_{(m',m)\in A_t(\tau)} Pr\{S_{t-1} = m'; S_t = m; Y_1^L\}}{Pr\{Y_1^L\}}$$

In the equation above $A_t(\tau)$ is the set of all state transitions (m',m) in the encoder which terminate at time t due to an information bit $d_\tau=0$. Recall that in general there are k source bits encoded into each n-bit encoder output symbol so that $d_\tau$ for indices $\tau=(t-1)k+1,\ (t-1)k+2,\ \ldots,\ tk$ are associated with the state transition $S_{t-1}$ to $S_t$.

$$Pr\{d_\tau = 1 \mid Y_1^L\} = \sum_{(m',m)\in B_t(\tau)} Pr\{S_{t-1} = m'; S_t = m \mid Y_1^L\} \qquad (15)$$

-continued $$= \frac{\sum_{(m',m) \in B_t(\tau)} Pr\{S_{t-1} = m'; S_t = m; Y_1^L\}}{Pr\{Y_1^L\}}$$

In the equation above $B_\tau(\tau)$ is the set of all state transitions (m',m) in the encoder which terminate at trellis level t due to an information bit $d_\tau=1$. Since we are working with the likelihood ratio $Pr\{d_\tau=1|Y_1^L\}/Pr\{d_\tau=0|Y_1^L\}$, it is not necessary to calculate $Pr\{S_{t-1}=m'; S_t=m|Y_1^L\}$; we may use $Pr\{S_{t-1}=m'; S_t=m; Y_1^L\}$, directly since $Pr\{Y_1^L\}$ is common to the numerator and denominator. Therefore, the desired likelihood ratio from the decoder is $$\lambda(d_\tau) = \frac{Pr\{d_\tau = 1 \mid Y_1^L\}}{Pr\{d_\tau = 0 \mid Y_1^L\}} = \frac{\sum_{(m',m) \in B_t(\tau)} Pr\{S_{t-1} = m'; S_t = m; Y_1^L\}}{\sum_{(m',m) \in A_t(\tau)} Pr\{S_{t-1} = m'; S_t = m; Y_1^L\}}. \quad (16)$$

Since the joint probability $Pr\{S_{t-1}=m'; S_t=m; Y_1^L\}$ is used often herein, the following notation from Bahl et al. is introduced for brevity.

$$\sigma_t(m',m) = Pr\{S_{t-1}=m'; S_t=m; Y_1^L\} = \alpha_{t-1}(m')\gamma_t(m',m)\beta_t(m) \quad (17)$$

When the encoder's input symbols are binary, i.e. k=1, equations (13) through (16) can be simplified since τ=t in this case. The simplified equations are presented below.

$$Pr\{S_t=m|S_{t-1}=m'\} = P\{d_t=a(m',m)\}, \text{ where} \quad (18)$$

a(m',m)=the bit value that drives the encoder from state m' to state m.

$$Pr\{d_t = 0 \mid Y_1^L\} = \sum_{(m',m) \in A_t} Pr\{S_{t-1} = m'; S_t = m \mid Y_1^L\} \quad (19)$$

$$= \frac{\sum_{(m',m) \in A_t} Pr\{S_{t-1} = m'; S_t = m; Y_1^L\}}{Pr\{Y_1^L\}}$$

$$= \frac{\sum_{(m',m) \in A_t} \sigma_t(m', m)}{Pr\{Y_1^L\}}, \text{ where}$$

$A_t$=the set of all state transitions (m',m) which terminate at level t in the encoder due to an information bit $d_t=0$.

$$Pr\{d_t = 1 \mid Y_1^L\} = \sum_{(m',m) \in B_t} Pr\{S_{t-1} = m'; S_t = m \mid Y_1^L\} \quad (20)$$

$$= \frac{\sum_{(m',m) \in B_t} Pr\{S_{t-1} = m'; S_t = m; Y_1^L\}}{Pr\{Y_1^L\}}$$

$$= \frac{\sum_{(m',m) \in B_t} \sigma_t(m', m)}{Pr\{Y_1^L\}}, \text{ where}$$

$B_t$=the set of all state transitions (m',m) which terminate at trellis level t in the encoder due to an information bit $d_t=1$.

$$\lambda(d_t) = \frac{Pr\{d_t = 1 \mid Y_1^L\}}{Pr\{d_t = 0 \mid Y_1^L\}} \quad (21)$$

$$= \frac{\sum_{(m',m) \in B_t} Pr\{S_{t-1} = m'; S_t = m; Y_1^L\}}{\sum_{(m',m) \in A_t} Pr\{S_{t-1} = m'; S_t = m; Y_1^L\}}$$

$$= \frac{\sum_{(m',m) \in B_t} \sigma_t(m', m)}{\sum_{(m',m) \in A_t} \sigma_t(m', m)}.$$

Code Word Segmented by the Encoder and Decoder

In accordance with preferred embodiments of the present invention, a trellis code word is segmented by both the encoder and a segmented symbol-by-symbol MAP decoder, advantageously reducing the decoder's required RAM. The encoder periodically returns to a known state by the insertion of "tail" or "merge" bits into the sequence of information bits from the source. The segmented MAP decoder takes advantage of knowing the state of the encoder at specified times to reduce decoding latency and the required memory as described below.

Consider an (n,k,v) encoder which produces n code bits for each k information bits provided as inputs thereto. Each k input bits is grouped into an input symbol that is associated with the corresponding n-bit output symbol. The memory of the encoder is vk bits (v input symbols). Let $I_{seg}$ equal the length of a code word segment in information bits. Now the encoding procedure can be summarized as follows for the case in which the known state is the zero state:

1. Set the state of the encoder at time t=0 equal to zero, i.e. $S_0=0$.
2. Set the segment size counter $c_{seg}$ to 0.
3. Shift k bits at a time into the encoder to produce a corresponding n-bit encoder output symbol.
4. Let $c_{seg}=c_{seg}+k$ and t=t+k If $c_{seg}<L_{seg}$ and t<L, go to Step 3; otherwise go to Step 5
5. Insert v (k-bit) "merge" symbols into the encoder to return the encoder to the zero state.
6. If t<L, go to Step 2; otherwise stop—code word is complete.

Figure 2:
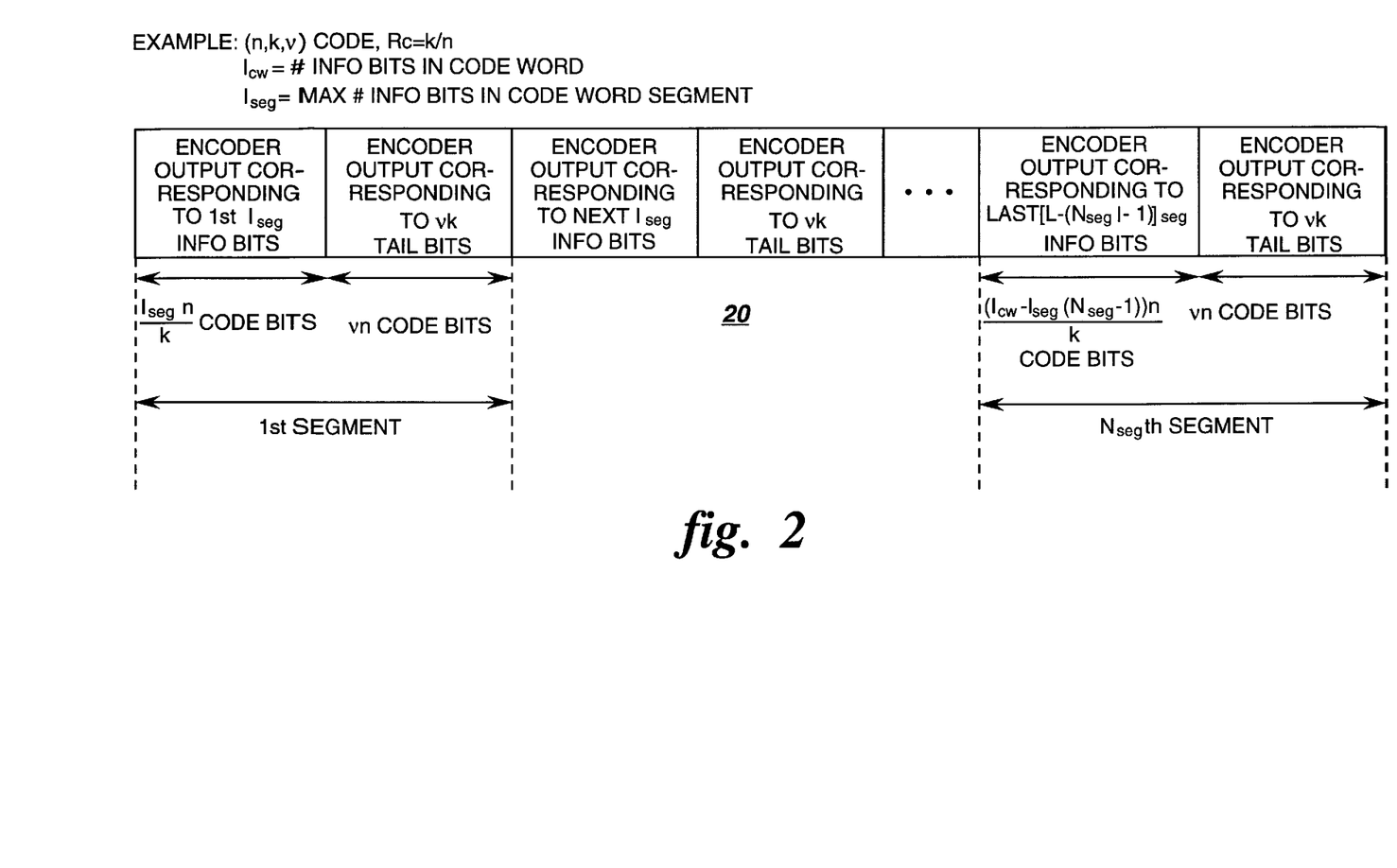
FIG. 2 is a block diagram illustrating the structure of a trellis code word having merged segments according to a preferred embodiment of the present invention.

The structure of the resulting code word 20 is shown in FIG. 2.

There is no loss of generality in assuming that the encoder is returned to the all-zeros state at specified times. It is possible to achieve the same effect by driving the encoder to arbitrary, but known, states at these times. Furthermore, the initial and terminal states need not be the same.

Figure 3A:
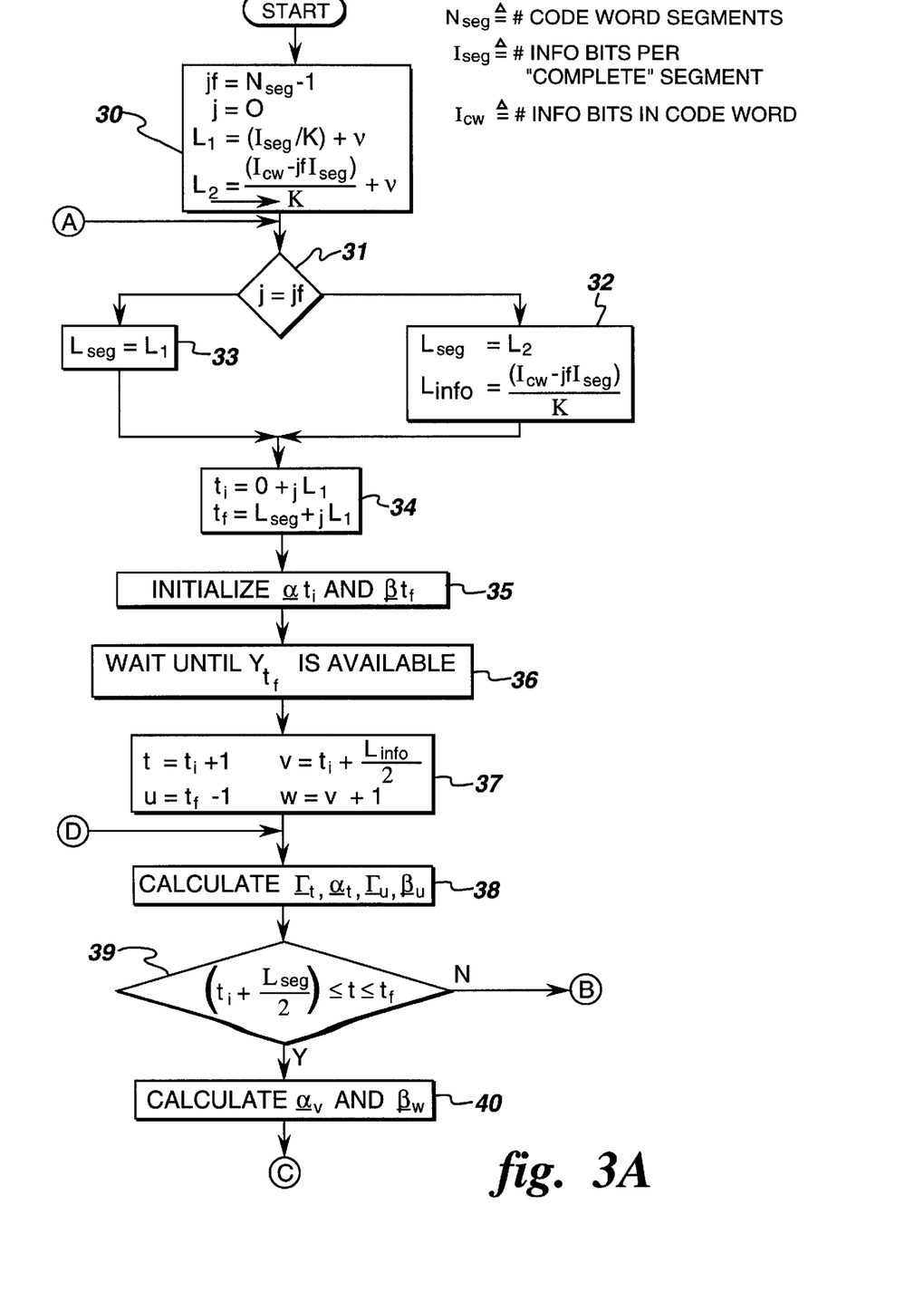
FIGS. 3A and 3B represent a flow chart of a MAP decoding algorithm for segmented trellis code words with merged segments according to a preferred embodiment of the present invention.
Figure 3B:
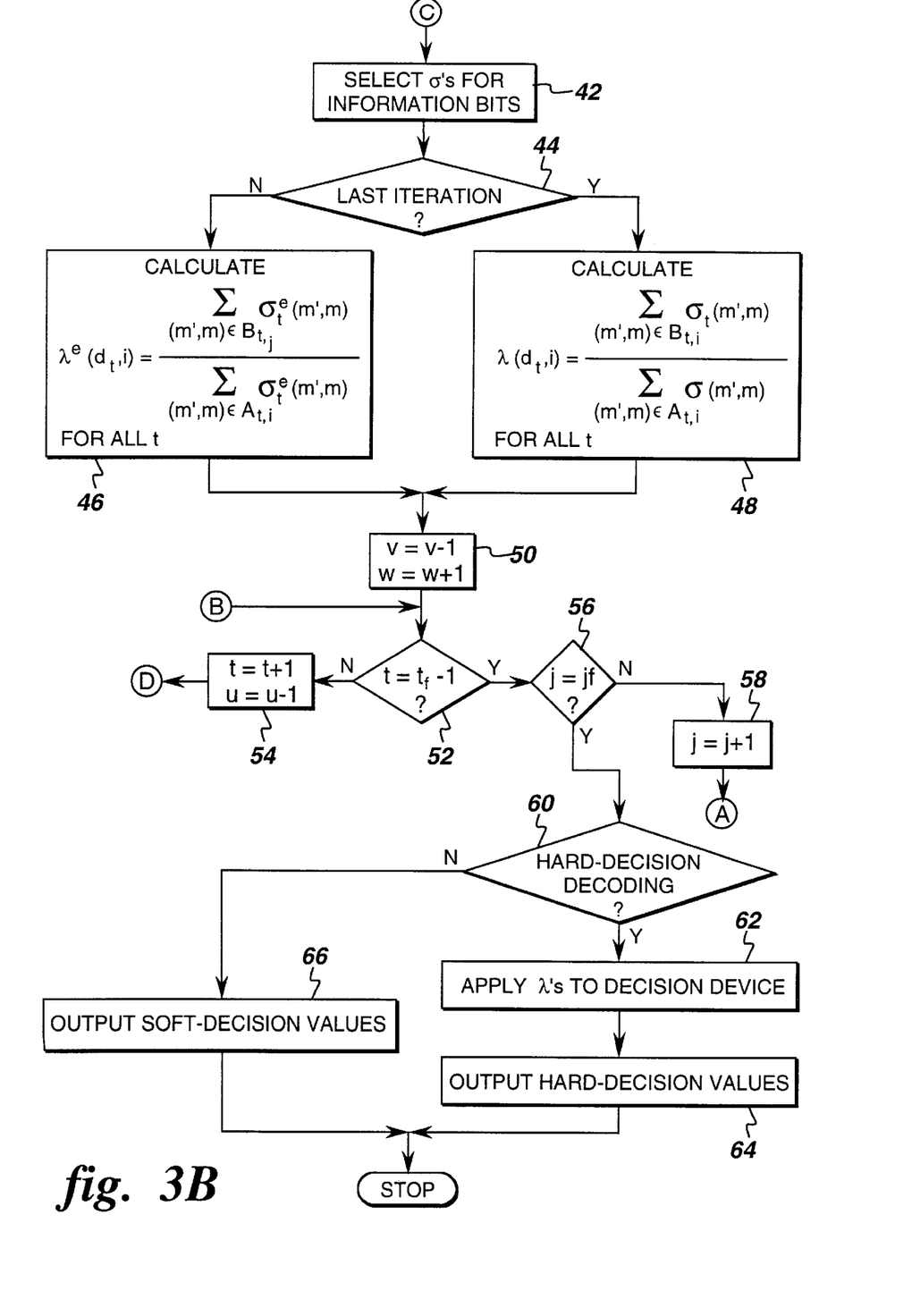

A symbol-by-symbol segmented MAP decoder in accordance with preferred embodiments of the present invention decodes a segmented code word having merged segments. The flow chart of FIGS. 3A and 3B accompanies the algorithm description below. In FIGS. 3A and 3B, an underlined variable denotes a vector comprising the values of that variable for all states or state transitions at the indicated time index. Let $N_{seg}$ be the number of code word segments, $I_{seg}$ be the number of information bits per "complete" segment, and $I_{cw}$ be the total number of information bits in the code word. All symbols received from the channel $Y_t$ are stored as they are received and may be discarded when the decoder has finished decoding the segment of which they are members.

In step 30, the follow indices are set: the decoder's segment index j=0; and the final segment index $j_f=(N_{seg}-1)$. The number of trellis levels is set to decode in a complete segment $L_1=(I_{seg}/k)+v$. The number of trellis levels is set to decode in a partial (last) segment $L_2=((I_{cw}-j_f I_{seg})/k)+v$.

Proceeding to steps 31–33, the decoder's trellis segment length $L_{seg}$ and the corresponding number of k-bit information symbols therein $L_{info}$ are determined as a function of the segment index as follows: If $j=j_f$, $L_{seg}=L_2$ and $L_{info}=(I_{cw}-j_f I_{seg})/k$ (step 32); otherwise $L_{seg}=L_1$ and $L_{info}=I_{seg}/k$ (step 33).

In step 34, the initial and final trellis level indices $t_i$ and $t_f$ are calculated, respectively, for the code word segment to be decoded next.

The next step 35 is an initialization step as follows: $\alpha_{t_i}(0)=1$ and $\alpha_{t_i}(m)=0$ for all $m \neq 0$. $\beta_{t_f}(0)=1$ and $\beta_{t_f}(m)=0$ for all $m \neq 0$.

As soon as the last symbol in the segment to be decoded $Y_{t_f}$ is received (step 36), the decoder begins decoding the $j^{th}$ code word segment. Variables t, u, v and w are initialized in step 37 as illustrated. In step 38, $\Gamma_t$, $\alpha_t$, $\Gamma_r$, and $\beta_u$ are calculated. In particular, the decoder computes $\gamma_t(m',m)$ using (12) and $\alpha_t(m)$ using (9) for $t=t_i+1, t_i+2, \ldots t_f$, beginning with $t=t_i+1$. Simultaneously, it computes $\gamma_{u+1}(m,m')$ using (12) and $\beta_u(m)$ using (10) for $u=(t_f-1), (t_f-2), \ldots, t_i+1$, beginning with $u=(t_f-1)$. The calculated values of $\alpha_t(m)$ are stored for $t=t_i+1, t_i+2, \ldots, t_i+(L_{seg}/2)$ and all m. The calculated values of $\beta_u(m)$ are stored for $u=(t_f-1), (t_f-2), \ldots, t_f-(L_{seg}/2)$ and all m. To clarify the discussion, let $\alpha_t=[\alpha_t(0), \alpha_t(1), \ldots \alpha_t(M-1)]$ and $\beta_u=[\beta_u(0), \beta_u(1), \ldots \beta_u(M-1)]$. The recursive calculation of $\alpha_t$ and $\beta_u$ continues until at least two sets of joint state transition probabilities can be calculated (step 39). When $L_{seg}$ is an even number, this occurs when $t=u=(t_i+L_{seg}/2)$. Then, calculate $\sigma_{t_i+(L_{seg}/2)}(m',m)$ and $\sigma_{t_i+(L_{seg}/2)+1}(m',m)$ using equation (17) (step 40). The calculation of these two state transition probabilities utilizes the two most recently calculated $\alpha$ and $\beta$ vectors. For the remaining $\alpha$ and $\beta$ recursions, two state transition probabilities are calculated. In calculating this pair, the current $\alpha_t$ and $\beta_u$ vectors are used so that they do not need to be stored. The other $\alpha$ and $\beta$ vectors required are read from memory. Therefore, when $\alpha_{t_f}$ and $\beta_{t_i+1}$ are calculated, the last two sets of state transition probabilities in this code word segment ($\sigma_{t_i+1}(m',m)$ and $\sigma_{t_f}(m',m)$) are immediately computed.

If the state transition probabilities for the last code word segment have been calculated, the state transition probabilities that correspond to the information bits in the code word are selected (step 42). Step 44 involves a test as to whether this is the last iteration. In either case, then an appropriate function (e.g. $\lambda_t(m',m)$) of the selected probabilities as the MAP decoder's soft-decision values is calculated in step 46 or 48, and operation proceeds to step 50 wherein v is decremented by 1 and w is incremented by 1. A test is then made in step 52 to determine whether $t=t_f-1$. If not then, t is incremented by 1 and u is decremented by 1 in step 54, and operation goes back to step 38. If so, then a test is made to determine whether $j=j_f$ in step 56. If not, then j is incremented by 1 in step 58, and operation goes back to step 31.

If $j=j_f$, then a decision is made as to whether hard-decision decoding is selected (step 60). If so, then step 62 applies the soft-decision values (e.g. $\lambda_t(m',m)$) corresponding to the information bits to a decision device, and step 52 outputs hard-decision values for the decoded information bits. If not, output soft-decision values that are some function of the computed $\sigma_t(m',m)$ are outputted in step 66.

As an alternative embodiment, the hard versus soft-decision output steps (60, 62, 64, 66) may be inserted after steps 46 and 48 and before step 50 in the process.

Figure 4:
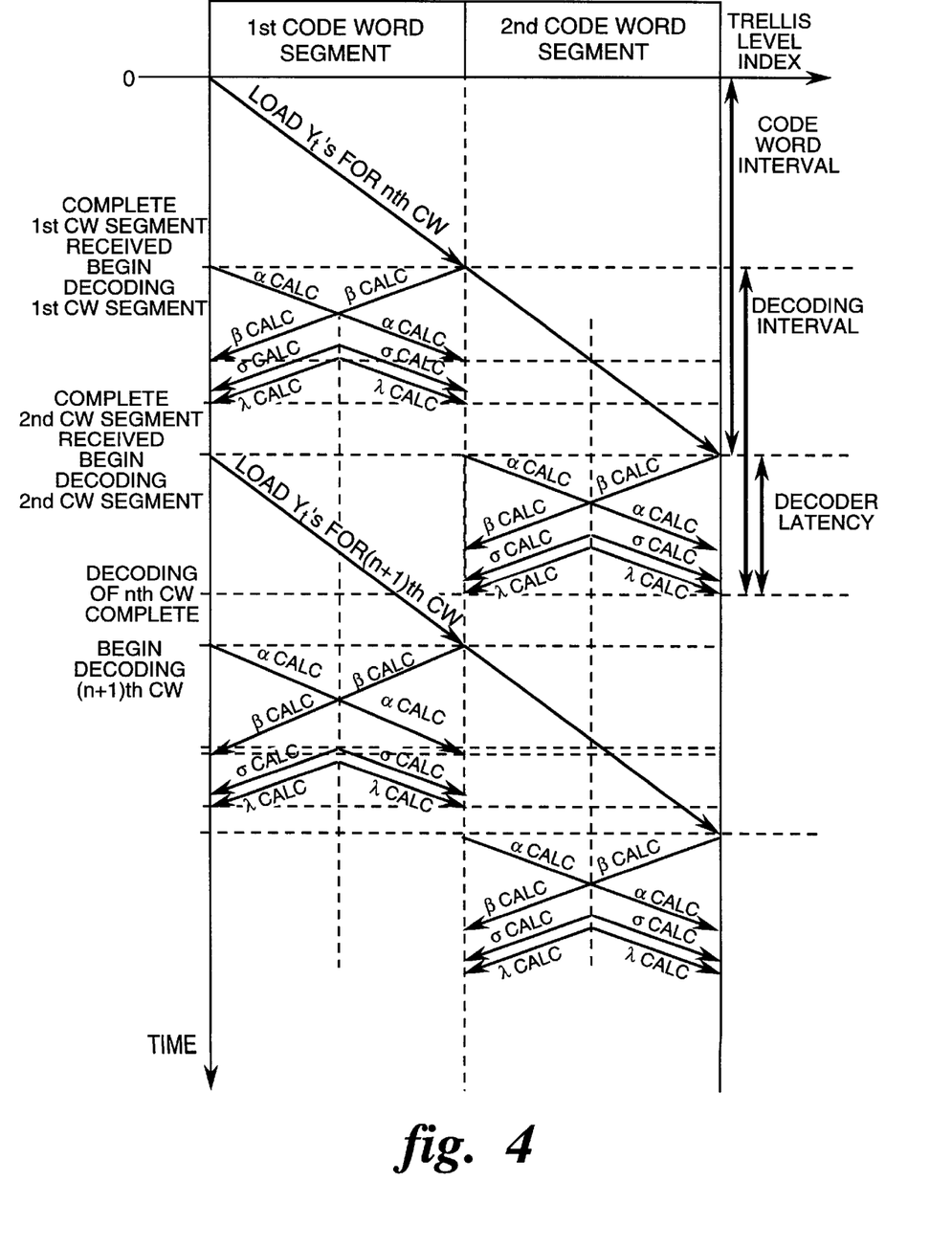
FIG. 4 is a segmented MAP decoder event time line for a trellis code word comprising two merged segments according to a preferred embodiment of the present invention.

FIG. 4 is a decoder event time line that describes time relationships among the various decoder calculations and illustrates the trellis level index of the received code word symbols involved in the decoding algorithm during various time intervals. The example shown in FIG. 4 is a code word 70 comprising two merged segments.

Application of Segmented Trellis Code Words to Turbo Coding

Figure 5:
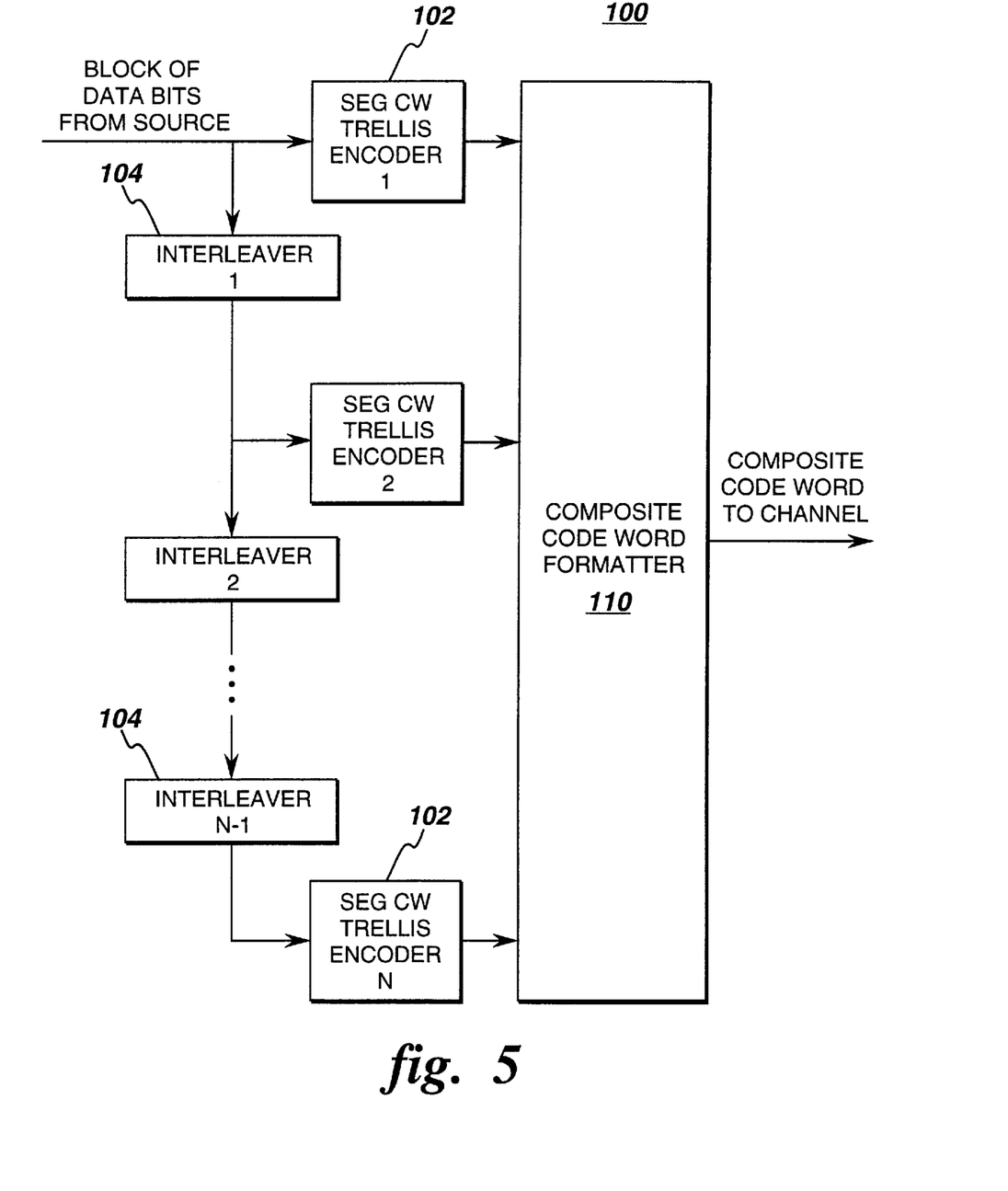
FIG. 5 is a block diagram of an encoder for parallel concatenated codes with segmented-code-word component encoders according to a preferred embodiment of the present invention.

Applications of segmented trellis code words to turbo coding in accordance with preferred embodiments of the present invention involve the use of encoders which produce segmented trellis code words as component encoders in an encoder for parallel concatenated codes (turbo codes) and the use of the segmented MAP algorithm decoder for segmented trellis code words described in the previous section as the component decoders in a decoder for such parallel concatenated codes. FIG. 5 is a block diagram of an encoder for parallel concatenated codes comprising segmented component code words generated by component encoders 102 and interleavers 104. The outputs of the component encoders are provided to a composite code word formatter 110.

Figure 6:
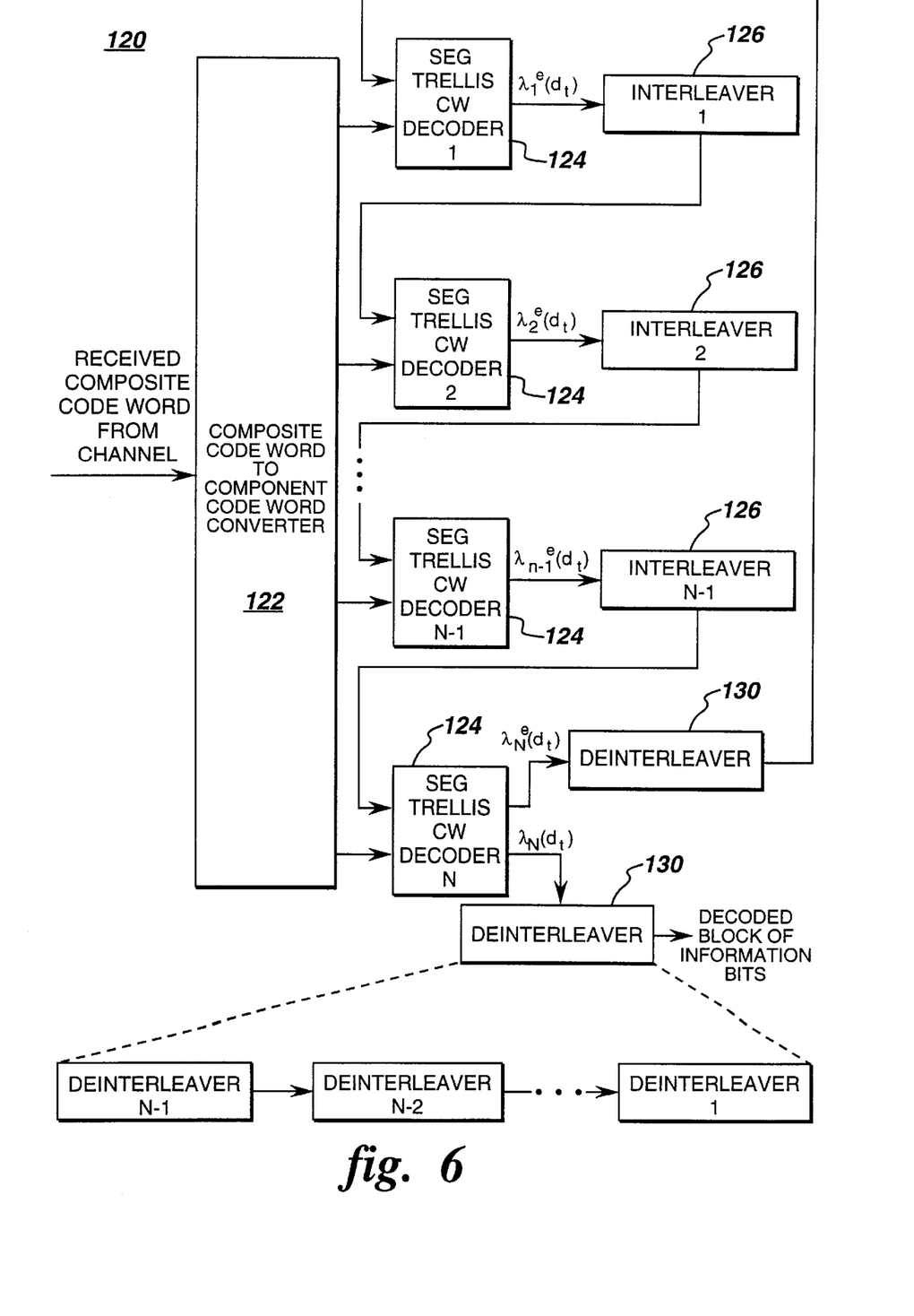
FIG. 6 is a block diagram of a decoder for parallel concatenated codes comprising segmented trellis component code words according to a preferred embodiment of the present invention.

FIG. 6 is a block diagram of a decoder 120 for decoding parallel concatenated codes associated with an encoder such as that illustrated in FIG. 5. The composite code word received from the channel is provided to a composite code word to component code word converter 122. The outputs of code word converter 122 are provided to component decoders 124 and interleavers 126 for decoding trellis code word segments. The output of the last component decoder 124 is provided to deinterleavers 130, as explained hereinbelow. In the preferred embodiments, the interleaver spans all codeword segments.

An important detail to highlight is that the interleaving of the information bits spans the code word segments. This is significant because the depth of the interleaving, which is related to the number of information bits in the code word, is an important factor in the performance of turbo codes. Thus, the coding gain for a given information block size is maintained even though the component decoders can operate on the smaller code word segments as if they were code words.

The exploded view of deinterleaver 130 in FIG. 6 illustrates the net transfer function of the permutation performed therein. In a practical implementation, only one permutation operation is necessary; it has the net effect of the N−1 deinterleavers concatenated as shown. Deinterleavers 1 through N−1 are the inverse reordering function of interleavers 1 through N−1, respectively. Further background information on parallel concatenated codes or turbo codes and decoders therefor can be found in U.S. Pat. No. 5,721, 745 of Stephen M. Hladik and John B. Anderson entitled "Parallel Concatenated Tail-Biting Convolutional Codes and Decoder Therefor", issued Feb. 24, 1998, and in "Illuminating the Structure of Code and Decoder of Parallel Concatenated Recursive Systematic (Turbo) Codes" by P. Robertson, 1994 IEEE Globecom conference, pp. 1298–1303, and in "A Comparison of Optimal and Sub-Optimal MAP Decoding Algorithms Operating in the Log Domain" by P. Robertson, E. Villebrun and P. Hoeher, *Proceedings of the IEEE International Conference on Communications* (ICC), June 1995, pp. 1009–1013.

The segmented MAP decoder according to preferred embodiments of the present invention does not allow positive feedback between the component decoders, unlike that of Bahl et al.. In particular, the extrinsic component of the likelihood ratio $\lambda^e(d_t)$ from the MAP decoder algorithm is used as the feedback between component decoders. The extrinsic component of the likelihood ratio is defined as follows, assuming the use of recursive systematic convolutional component codes.

$$\lambda^e(d_t) = \frac{\sum_{(m',m)\in B_t} \sigma_t^e(m',m)}{\sum_{(m',m)\in B_t} \sigma_t^e(m',m)}, \text{ where} \quad (22)$$

$$\sigma_t^e(m',m) = \alpha_{t-1}(m')\gamma_t^e(m',m)\beta_t(m), \quad (23)$$

$$\gamma_t^e(m',m)Pr_i\{S_t = m \mid S_{t-1} = m'\}\prod_{i=1}^{(n-k)} Pr\{y_t^p(i) \mid X\}, \quad (24)$$

$Pr_i\{S_t=m|S_{t-1}=m'\}$=initial conditional state probability defined by equation (13) and the source statistics, $Y_t = (y_t^S(1), \ldots y_t^S(k), y_t^P(1), \ldots y_t^P(n-k))$ $y_t^S(i)$=the channel output symbol corresponding to the $i^{th}$ systematic bit of the encoder output symbol at time t, and $y_t^P(i)$=the channel output symbol corresponding to the $i^{th}$ parity bit of the encoder output symbol at time t.

Equation (24) above holds for binary signaling over a memoryless channel. The conditional state probabilities are calculated as a function of the a priori source statistics, not the a posteriori estimates of the source bit probabilities. If the source bits are equally likely, $$Pr_i\{S_t = m \mid S_{t-1} = m'\} = \frac{1}{2^k}.$$

In this case, it is easily shown that this term may be dropped from equation (24) when calculating $\lambda^e(d_t)$ since it is a factor of both the numerator and denominator of equation (22). Therefore, the equation for the extrinsic component of the gamma term becomes $$\gamma_t^e(m',m) = \prod_{i=1}^{(n-k)} Pr\{y_t^p(i) \mid X\}. \quad (25)$$

In other words, the joint probability of a state transition from state m' to state m and observing the received sequence $Y_1^L$, $\gamma_t^e(m',m)=Pr\{S_t=m; Y_t|S_{t-1}=m'\}$, is calculated assuming no a priori information about the information bits other than possibly the source statistics. In addition, the use of $\gamma_t^e(m',m)$ in (23) means that channel observations corresponding to the systematic bits of the encoder output symbol at time t, which are inputs that are common to all component decoders, are not used directly in information that is passed from one decoder to the next. Rather, the a posteriori information passed from one decoder to the next is based directly on only independent channel observations from different sets of parity bits.

In turbo decoding, the subsequent decoder obtains estimates of the information bits' a priori probabilities from the permuted a posteriori likelihood ratio values calculated by the previous decoder using the definition of the likelihood ratio:

$$\lambda(d_t) = \frac{Pr\{d_t = 1\}}{Pr\{d_t = 0\}}. \quad (26)$$

Using this definition and $Pr\{d_t=0\}+Pr\{d_t=1\}=1$, we obtain $$Pr\{d_t = 0\} = \frac{1}{1 + \lambda_i^e(d_t)} \quad (27)$$

and $$Pr\{d_t = 1\} = \frac{\lambda_i^e(d_t)}{1 + \lambda_i^e(d_t)} \quad (28)$$

for a priori bit probabilities in component decoder number c(i+1), where i=index of the preceding component decoder and c(i+1)=(i mod N)+1. (See FIG. 6.) That is, the a posteriori likelihood ratios of the preceding decoder are used as the a priori likelihood ratios in the decoder that follows.

As in the standard MAP algorithm, $\gamma_t(m',m)$ is used to calculate the values of $\alpha_t(m)$ and $\beta_{t-1}(m')$ recursively. In contrast to the calculation of $\gamma_t^e(m',m)$, the a priori conditional state probabilities $Pr\{S_t=m|S_{t-1}=m'\}$ required to calculate $\gamma_t$ are calculated from the bit a priori probabilities obtained from equations (27) and (28). In the calculation of the $\alpha_t(m)$ and $\beta_t(m)$ terms, the decoder utilizes the available a posteriori bit probabilities, which become more reliable with each iteration, to improve decoding performance. For the first iteration by the first component decoder, the a priori bit probabilities are $Pr\{d_t=0\}=Pr\{d_t=1\}=0.5$, and all state transitions are generally assumed to be equally likely, i.e. $Pr\{S_t=m|S_{t-1}=m'\}=\frac{1}{2^k}$.

On the last decoding iteration, our turbo decoder uses equation (17) for $\sigma_t(m',m)$ and equation (16) for $\lambda_t(d_t)$ in order to utilize all available information in the output likelihood ratio. At this time, the last component decoder's outputs are used as the turbo decoder's soft-decision outputs. If hard-decision decoding is desired, these outputs are used as the decision statistics.

Figure 7:
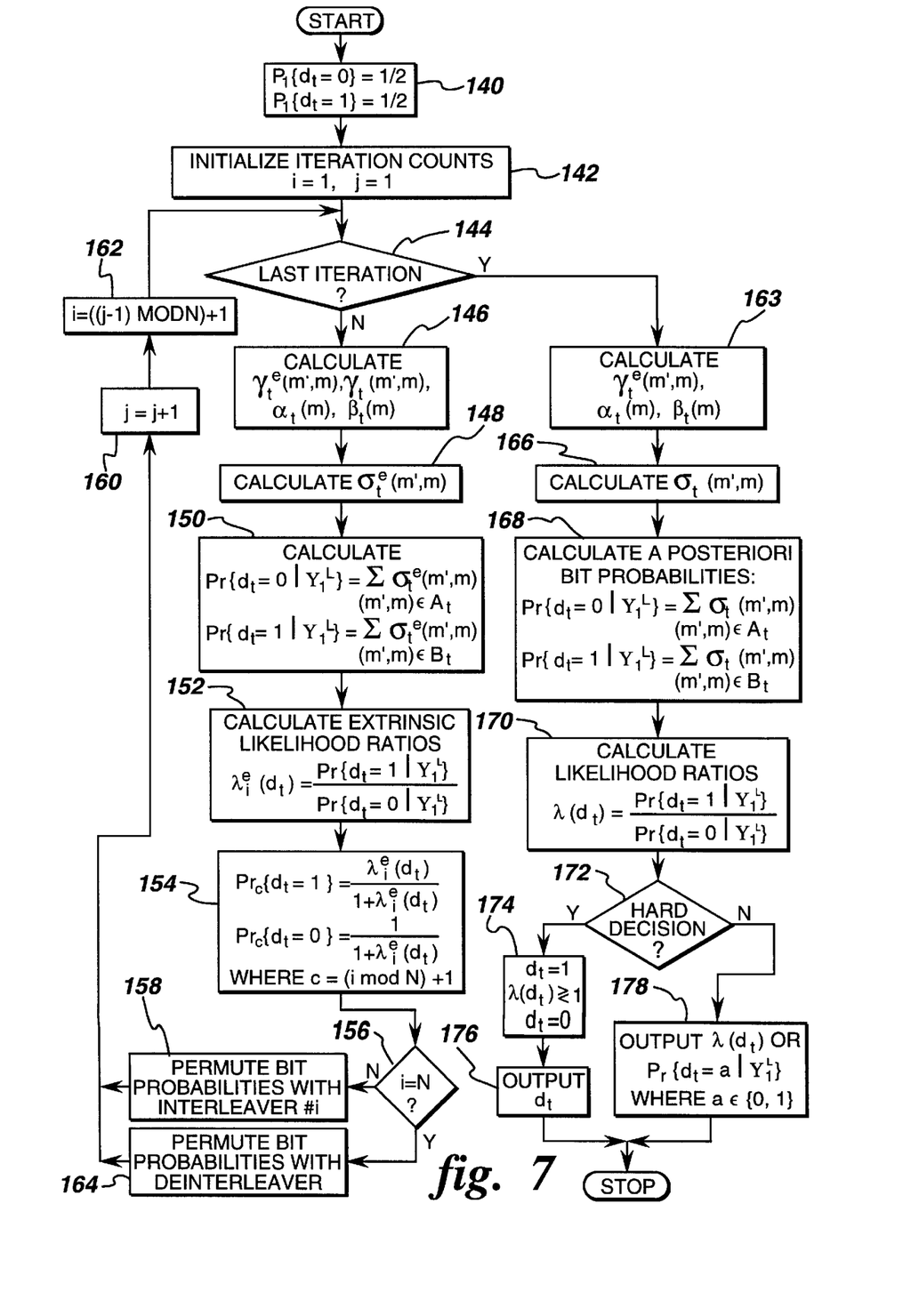
FIG. 7 represent a flow chart illustrating operation of a turbo decoder comprising segmented MAP component decoders in accordance with preferred embodiments of the present invention.

The flow chart of FIG. 7 summarizes the operation of a turbo decoder comprising segmented MAP component decoders in accordance with preferred embodiments of the present invention. As stated above and shown in flow chart step 140, for the first decoding iteration, the a priori bit probabilities are $Pr\{d_t=0\}=Pr\{d_t=1\}=0.5$. In step 142, the iteration counts i and j are each set to one. If in decision step 144, it is decided that it is not the last iteration, then $\gamma_t^e(m',m)$, $\gamma_t(m',m),\alpha_t(m)$ and $\beta_t(m)$ are calculated in step 146. Then in step 148, $\sigma_t^e(m',m)$ is calculated as set forth in equation (23). Next in step 150, the a posteriori probabilities that a data bit from the source is equal to 0 or 1 (equation (14)). From the results of step 150, the extrinsic likelihood ratios are calculated in step 152 as described hereinabove. In step 154, the a priori bit probabilities are calculated in accordance with equations (27) and (28). A decision is then made in step 156 as to whether the counter i has counted the number N of interleavers. If not, the process goes to step 158 wherein the bit probabilities are permuted with interleaver number i. In steps 160 and 162, the counters i and j, respectively, are incremented. The process proceeds back to decision step 144 to determine whether it is the last iteration. If so, in step 163, $\gamma_t(m',m),\alpha_t(m)$ and $\beta_t(m)$ are calculated. Next, in step 166, equation (17) is used to calculate $\sigma_t(m',m)$. The a posteriori bit probabilities are calculated in step 168, and the likelihood ratios are calculated in step 170. A decision is made in step 172 as to whether hard decision decoding is desired. If so, hard decision outputs are determined in step 174 and output in step 176. If not, the last decoder's outputs are used as the turbo coder's soft-decision outputs in step 178.

Description of the Log-MAP Decoder

The MAP decoder algorithm presented earlier requires a large number of multiplications. For some implementations wherein a large number of multiplications may be impractical, e.g., integrated circuit implementations, a logarithmic version of the MAP algorithm has been derived that eliminates all multiplication operations. The log-MAP algorithm primarily uses additions, table look-ups, and some simple logic functions. In an integrated circuit implementation of a decoder for trellis codes, the replacement of multiplications with additions enables large savings in gate count (die area) and significant increases in decoding speed. The following is a summary of the basic log-MAP algorithm.

Equations (7) through (10) become $$\ln Pr\{S_t=m; Y_1^L\} = \ln \alpha_t(m) + \ln \beta_t(m), \quad (29)$$

$$\ln Pr\{S_{t-1}=m'; S_t=m; Y_1^L\} = \ln \sigma_t(m',m) = \ln \alpha_{t-1}(m') + \ln \gamma_t(m',m) + \ln \gamma_t(m), \quad (30)$$

$$\ln \alpha_t(m) = \ln \sum_{m'=0}^{M-1} \exp(\ln \alpha_{t-1}(m') + \ln \gamma_t(m', m)), \quad (31)$$

and $$\ln \beta_t(m) = \ln \sum_{m'=0}^{M-1} \exp(\ln \beta_{t+1}(m') + \ln \gamma_{t+1}(m, m')). \quad (32)$$

Equations (31) and (32) are derived from equations (9) and (10), respectively, by applying the identity $$a \cdot b = \exp(\ln[a \cdot b]) = \exp(\ln a + \ln b)$$

to the product terms. For example, equation (31) is derived as follows:

$$\ln \alpha_t(m) = \ln \sum_{m'=0}^{M-1} \alpha_{t-1}(m') \gamma_t(m', m)$$

$$= \ln \sum_{m'=0}^{M-1} \exp(\ln[\alpha_{t-1}(m') \gamma_t(m', m)])$$

$$= \ln \sum_{m'=0}^{M-1} \exp(\ln \alpha_{t-1}(m') + \ln \gamma_t(m', m)).$$

The boundary conditions are now $\ln \alpha_0(0) = 0$ and $\ln \alpha_0(m) = -\infty$ for all $m \neq 0$. Similarly, $\ln \beta_L(0) = 0$ and $\ln \beta_L(m) = -\infty$ for all $m \neq 0$. In a practical implementation, a large negative number is substituted for $-\infty$.

The sum of exponential terms can be computed by applying the following identity.

$$\ln[\exp(a) + \exp(b)] = \max(a,b) + \ln[1 + \exp(-|a-b|)] \quad (33)$$

Computational complexity can be significantly reduced by storing a table of values for the function $\ln[1+\exp(-|a-b|)]$ and applying equation (33). Experimentation has shown that 8 or 16 values of this function provides sufficient resolution to prevent performance degradation.

Equation (12) becomes $$\ln \gamma_t(m',m) = \ln Pr\{S_t=m|S_{t-1}=m'\} + \ln Pr\{Y_t|X\}. \quad (34)$$

Description of a Turbo Decoder for Segmented Turbo Code Words Utilizing Log-MAP Component Decoders In a manner similar to that described hereinabove in the Application of Segmented Trellis Code Words to Turbo Coding section, the log-MAP algorithm decoder can be modified to decode the component code words of parallel concatenated codes comprising segmented trellis code words. For turbo decoding, equations (29) through (34) are augmented with the logarithmic versions of equations (22) through (28) summarized below.

$$\Lambda^e(d_t) = \ln \lambda^e(d_t) = \ln \sum_{(m',m) \in B_t} \sigma_t^e(m', m) - \ln \sum_{(m',m) \in A_t} \sigma_t^e(m', m) \quad (35)$$

where $$\ln \sigma_t^e(m', m) = \ln \alpha_{t-1}(m') + \ln \gamma_t^e(m', m) + \ln \beta_t(m), \quad (36)$$

$$\ln \gamma_t^e(m', m) = \ln Pr_i\{S_t = m | S_{t-1} = m'\} + \sum_{i=1}^{(n-k)} \ln Pr\{y_t^P(i) | X\}, \quad (37)$$

$\ln Pr_i\{S_t = m | S_{t-1} = m'\}$ = natural logarithm of initial condition state probability defined by equation (13) and the source statistics, $Y_t = (y_t^S(1), \ldots y_t^S(k), y_t^P(1), \ldots y_t^P(n-k))$, $y_t^S(i)$ = the channel output symbol corresponding to the $i^{th}$ systematic bit of the encoder output symbol at time t, and $y_t^P(i)$ = the channel output symbol corresponding to the $i^{th}$ parity bit of the encoder output symbol at time t.

Recall that the conditional state probabilities in equation (37) are calculated as a function of the a priori source statistics. Therefore, if the source bits are equally likely, $$Pr_i\{S_t = m | S_{t-1} = m'\} = \frac{1}{2^k}.$$

In this case, it is easily shown that this term may be dropped from equation (37) when calculating $\Lambda^e(d_t)$ since it is an addend of both summations in equation (35). Therefore, the equation for the extrinsic component of the gamma term becomes $$\ln \gamma_t^e(m', m) = \sum_{i=1}^{(n-k)} \ln Pr\{y_t^P(i) | X\}. \quad (38)$$

In turbo decoding, the subsequent decoder obtains estimates of the information bits' a priori probabilities from the permuted a posteriori log-likelihood ratio values calculated by the previous decoder using the definition of the log-likelihood ratio:

$$\Lambda(d_t) = \ln \lambda(d_t) = \ln \left[ \frac{Pr\{d_t = 1\}}{Pr\{d_t = 0\}} \right] = \ln Pr\{d_t = 1\} - \ln Pr\{d_t = 0\}. \quad (39)$$

Using this definition and $Pr\{d_t=0\}+Pr\{d_t=1\}=1$, we obtain $$\ln Pr\{d_t = 0\} = -\ln[1 + \Lambda_t^e(d_t)] = -\ln[e^0 + e^{\ln \Lambda_t^e(d_t)}] \quad (40)$$

and

-continued $$\ln\Pr\{d_t = 1\} = \Lambda_i^e(d_t) - \ln[1 + \Lambda_i^e(d_t)] = \qquad (41)$$
$$\Lambda_i^e(d_t) - \ln[e^0 + e^{\ln\Lambda_i^e(d_t)}] = \Lambda_i^e(d_t) + \ln\Pr\{d_t = 0\}$$

for the logarithm of a priori bit probabilities in component decoder number c(i+1), where i=the index of the preceding component decoder and c(i+1)=(i mod N)+1. As shown in FIG. 6, the extrinsic component of the a posteriori log-likelihood ratios of the preceding decoder are used as the a priori log-likelihood ratios in the decoder that follows.

Figure 8:
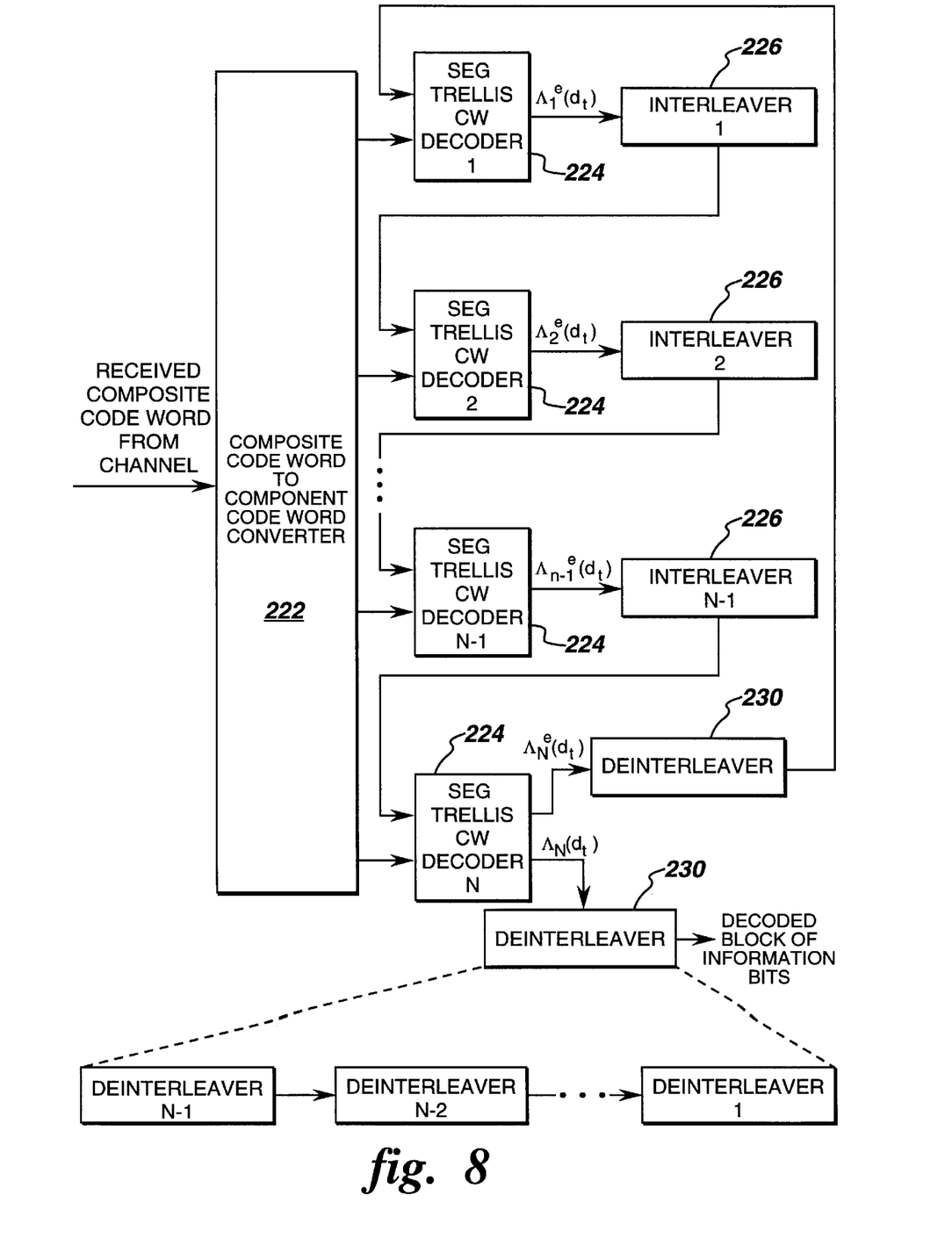
FIG. 8 is a block diagram of a decoder for segmented turbo code words comprising log-MAP-type component decoders.

FIG. 8 is a block diagram of a decoder for segmented turbo code words comprising log-MAP-type component decoders according to preferred embodiments of the present invention. The structure of FIG. 8 is similar to that of FIG. 6 with the following components as shown: a composite code word to component code word converter 222, log-MAP-type component decoders 224, interleavers 226, and deinterleavers 230.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A method for encoding digital data into trellis code words, each code word comprising a predetermined number of information bits $I_{cw}$, generated by a source, the method comprising the steps of:
   (a) setting a predetermined maximum number of information bits in a code word segment $I_{seg}$;
   (b) for each $I_{cw}$ information bits, shifting groups of the information bits generated by the source into an encoder, each group comprising $I_{seg}$ information bits if there is no remainder of $I_{cw}/I_{seg}$ information bits, and if there is a remainder of $I_{cw}/I_{seg}$ information bits, each group except the last group comprising $I_{seg}$ information bits with the last group comprising the remainder; and
   (c) shifting a predetermined number of merge symbols into the encoder after each group of information bits shifted into the encoder in order to return the encoder to a predetermined known state.

2. The method of claim 1 wherein the encoder comprises a recursive systematic convolutional encoder.

3. The method of claim 1 wherein the encoder comprises a component encoder in a parallel concatenated convolutional encoding process.

4. A method for decoding a segmented trellis code word having merged trellis segments, the method comprising the steps of:
   determining a trellis code word segment length and the corresponding number of information bits therein; and
   decoding each respective segment upon receipt of the last symbol thereof by calculating maximum a posteriori probabilities associated with each trellis code word segment.

5. The method of claim 4 wherein the decoding step comprises simultaneously calculating forward state probabilities and backward state probabilities associated with each received trellis code word segment for each trellis time index in the code word segment and each trellis state index; a posteriori state transition probabilities for the received code word segments being calculated beginning when the forward and backward state probability calculations coincide in time; the corresponding likelihood ratios being calculated as a function of the state transition probabilities.

6. The method of claim 5 wherein the decoding step is performed in a component decoder in a turbo decoding process.

7. The method of claim 5 wherein two sets of a posteriori state transition probabilities and two sets of corresponding likelihood ratios are calculated per each set of forward state probabilities and backward state probabilities calculated beyond the point of coincidence.

8. The method of claim 4 wherein the decoding step comprises calculating logarithmic maximum a posteriori probabilities associated with the trellis code word.

9. The method of claim 8 wherein the decoding step is performed in a component decoder in a turbo decoding process.

10. The method of claim 9 wherein an extrinsic component of the likelihood ratios comprises feedback between component decoders in the turbo decoding process.

11. The method of claim 4, further comprising the step of providing soft-decision output.

12. The method of claim 4, further comprising the step of providing hard-decision output.

13. An encoder for encoding digital data into trellis code words, each code word comprising a predetermined number of information bits $I_{cw}$, generated by a source, comprising:
   an index calculator for setting a predetermined maximum number of information bits in a code word segment $I_{seg}$;
   a shift register for shifting groups of the information bits generated by the source into an encoder, each group comprising $I_{seg}$ information bits if there is no remainder of $I_{cw}/I_{seg}$ information bits, and if there is a remainder of $I_{cw}/I_{seg}$ information bits, each group except the last group comprising $I_{seg}$ information bits with the last group comprising the remainder; the shift register shifting a predetermined number of merge symbols into the encoder after each group of information bits shifted into the encoder in order to return the encoder to a predetermined known state.

14. The encoder of claim 13, comprising a recursive systematic convolutional encoder.

15. The encoder of claim 13, comprising a component encoder in a parallel concatenated convolutional encoder.

16. A decoder for decoding a segmented trellis code word having merged trellis segments comprising:
   an index counter for determining a trellis code word segment length and the corresponding number of information bits therein; and
   a segment decoder for decoding each respective segment upon receipt of the last symbol thereof by calculating maximum a posteriori probabilities associated with each trellis code word segment.

17. The decoder of claim 16 wherein the segment decoder simultaneously calculates forward state probabilities and backward state probabilities associated with each received trellis code word segment for each trellis time index in the code word segment and each trellis state index; a posteriori state transition probabilities for the received code word segments being calculated beginning when the forward and backward state probability calculations coincide in time; the corresponding likelihood ratios being calculated as a function of the state transition probabilities.

18. The decoder of claim 17, comprising a component decoder in a turbo decoder.

19. The decoder of claim 18, comprising a log-MAP decoder.

20. The decoder of claim 19, further comprising a feedback control for feeding back an extrinsic component of the likelihood ratios between component decoders in the turbo decoder.

* * * * *